United States Patent [19]

Miller

[11] Patent Number: 4,544,571

[45] Date of Patent: Oct. 1, 1985

[54] METHOD OF MANUFACTURE OF EMI/RFI VAPOR DEPOSITED COMPOSITE SHIELDING PANEL

[75] Inventor: Walter J. Miller, Philadelphia, Pa.

[73] Assignee: Pennwalt Corporation, Philadelphia, Pa.

[21] Appl. No.: 579,332

[22] Filed: Feb. 13, 1984

[51] Int. Cl.⁴ .......................... B05D 3/06; H05K 9/00
[52] U.S. Cl. ................................ 427/40; 174/35 MS; 427/39; 427/250; 427/404
[58] Field of Search ............ 427/40, 250, 404, 39; 428/623, 626, 630; 174/35 MS; 250/515.1, 519.1

[56] References Cited

U.S. PATENT DOCUMENTS

| | | | |
|---|---|---|---|
| 3,305,460 | 2/1967 | Lacy | 427/404 X |
| 3,332,860 | 7/1967 | Diebold et al. | 174/35 MS X |
| 4,234,628 | 11/1980 | DuRose | 427/404 X |
| 4,407,871 | 10/1983 | Eisfeller | 427/250 X |

Primary Examiner—Evan K. Lawrence

[57] ABSTRACT

An EMI/RFI shielding panel prepared by glow discharge treatment of a substrate material to provide a chemically reactive surface, and then successively vapor plating the surface with an adhesive layer of chromium or stainless steel, a shielding layer of copper or aluminum onto the adhesive layer, and then a protective layer of chromium or aluminum onto the shielding layer.

9 Claims, 2 Drawing Figures

METHOD OF MANUFACTURE OF EMI/RFI VAPOR DEPOSITED COMPOSITE SHIELDING PANEL

BACKGROUND OF THE INVENTION

The present invention relates to a method of manufacturing a panel for shielding the passage of electromagnetic radio frequency radiation interference therethrough.

The problem of such interference has been on a rapid increase due to the proliferation of electronic equipment such as computers and the like that emit such radiation, particularly in the 500 KH$_Z$ to 1 GH$_Z$ region. The Federal Communications Commission has issued regulations limiting such radiation emissions to the environment to low levels, which therefore requires adequate shielding of such radiation interference emitting electronic equipment in most instances. Most such shielding is now formed by applying relatively thick coats of nickel-acrylic paints over the appropriate substrate. A zinc arc spray treatment of substrates is also somewhat effective. The nickel-acrylic methods are most prevalent in the field because of low initial capital investment with relatively good shielding effectiveness, while having good mechanical and thermal properties at a thickness of 2 to 3 mils. The primary disadvantage of the nickel-acrylic coating is that the deposition thickness depends on the skill of the individual spray operator and quality control can be a problem. If the coating is too thick cracking and delamination occur, and if it is too thin inadequate shielding results. Moreover, the coating process is labor intensive and has relatively high material cost.

There are also some "in-plastic" techniques whereby fillers such as: aluminum flake and/or powder, stainless steel fibers, carbon flake and/or powder, carbon mat, and, more recently, conductive polymeric materials; are incorporated within the interior of the plastic substrate. The widely used "on-plastic" techniques include application of nickel, copper and silver paints, zinc arc sprayed layers, ion plated layers, electro and electrolessly deposited nickel and copper, and vacuum deposited (thermally) layers.

The method and resulting panel of this invention overcome the deficiencies with the prior art techniques. The process of the present invention provides a cost effective method for producing a panel of high durability, effectiveness, and low cost. Existing vacuum metalizing equipment can be modified at relatively low cost to glow (glo)-discharge treat in situ the surface of the substrate to be coated, followed by successive vapor deposition of the three distinct layers to form the durable shielding composite coating.

SUMMARY OF THE INVENTION

The method of this invention is defined as a method of manufacturing a panel for shielding the passage of electromagnetic radio frequency interference therethrough, comprising:

(a) subjecting a surface of a substrate sheet material to glow-discharge treatment to provide an active surface that is chemically reactive with vapors of chromium or stainless steel at an air pressure less than about $5 \times 10^{-5}$ TORR;

(b) vapor plating chromium or stainless steel onto said active surface to provide an adhesive layer of chromium or stainless steel chemically bound to said surface, said layer having a thickness within the range of about 300 Angstroms to about 1,000 Angstroms;

(c) vapor plating an aluminum or copper shielding layer onto the adhesive layer of (b) prior to substantial oxidation of the adhesive layer surface, said shielding layer having a thickness within the range of about 1,000 Angstroms to about 50,000 Angstroms; and then (d) vapor plating a chromium protective layer onto said shielding layer of (c), said protective layer having a thickness of at least about 1,000 Angstroms; to provide a relatively low cost, durable, shielded panel.

It is preferred that the glow-discharge treatment of the surface in (a) be conducted at a pressure of about 100 to 200 microns of mercury with a plasma voltage of about 1,000 to 2,000 volts. It is preferred that the vapor plating in (b), (c), and (d) above be conducted at an air pressure of less than about $5 \times 10^{-5}$ TORR. Preferably the adhesive layer (b) is comprised of chromium having a thickness within the range of about 300 to 500 Angstroms. It is preferred that the shielding layer be comprised of copper having a thickness within the range of about 2,000 to 10,000 Angstroms. Preferably, the protective layer is comprised of chromium having a thickness within the range of about 2,000 to 5,000 Angstroms. Many polymeric plastic materials, ceramics, and glass provide suitable substrates. The primary criteria is that the substrate surface, when subjected to glow-discharge treatment, becomes highly reactive with vapors of chromium or stainless steel at the vacuum pressure utilized for vapor plating to provide tenacious chemical bonds. Suitable substrates are polyphenylene (sold under the General Electric trademark, NORYL), polyacrylonitrile-butadiene-styrene (ABS), polyimides, polyesters, polyamides, polycarbonates, glass, and ceramics, to name a few. The thickness of the substrate is not critical, but rather must be of sufficient thickness to provide adequate integrity. Generally, thicknesses of about 0.125 inch are satisfactory and the range of thicknesses can be between about 0.06 and 0.3 inch. Of course, thicker substrates would only add to cost of the panel while adding little, if any, benefit.

BRIEF DESCRIPTION OF DRAWINGS

With reference to FIG. 2, substrate 10 is shown with the vapor deposited chromium or stainless steel layer 11 onto which has been vapor deposited the shielding coating of copper or aluminum 12, and finally the protective layer of chrome or stainless steel 13 which has been vapor deposited onto the shielding coating 12.

DETAILED DESCRIPTION

Figure 1:
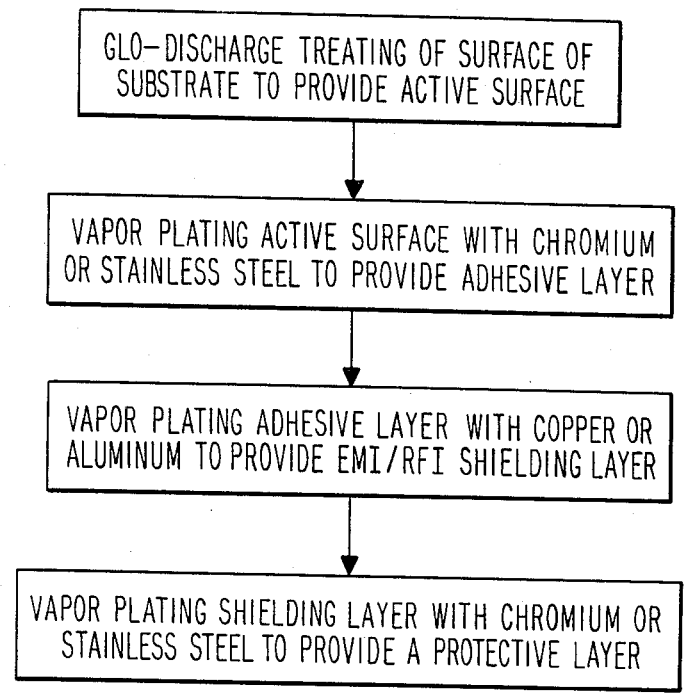
FIG. 1 is schematic diagram listing the various process steps to practice the method of this invention.
Figure 2:
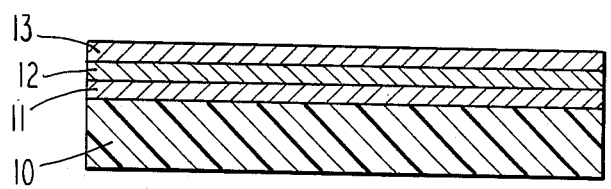
FIG. 2 is a cross sectional view of the panel of this invention illustrating the substrate material 10 and the three vapor deposited layers (11, 12, 13,) forming the durable shielding composite coating.

The process of this invention can be carried out with existing commercial vapor metalizing equipment. Preferably such equipment is modified to allow for dual firing of the different metal layers and also the appropriate electrode is provided so that glo-discharge treatment can take place in situ. Full cycle time for a typical 6 foot diameter by 6 foot long vacuum chamber is about 20 minutes.

EXAMPLE

A 12-inch square by 0.125 inch thick polyphenylene (NORYL) substrate was subjected to glow-discharge cleaning for about 3 minutes in situ in a vacuum metalizing chamber equipped with a dual firing mechanism. The glow-discharge conditions included an air pressure of 100 to 200 microns of mercury with a plasma voltage of about 1,500 volts, which provided a current of about 200 milliamps. Immediately after the glow-discharge treatment that provided an active substrate surface, the surface was vapor plated with an adhesive layer of chromium to provide a chromium thickness of about 500 Angstroms. The pressure within the vessel for all vapor plating was below about $5 \times 10^{-5}$ TORR. The adhesive chromium layer was next vapor plated with a copper shielding layer to a thickness of about 1,100 Angstroms. The copper shielding layer was next vapor plated with another chromium layer to form a protective coating. This protective layer of chromium had a thickness of about 1,000 Angstroms to provide abrasion resistance and to prevent oxidation of the copper shielding layer.

A similar substrate conventionally coated with nickel-acrylic paint to a thickness of 2.5 mil was utilized as a control for testing. A comparison of the shielding effectiveness is shown in the table below.

| Frq. MHZ | Shielding Effectiveness in Decibels | | | | | | | |
|---|---|---|---|---|---|---|---|---|
| | 30 | 60 | 70 | 100 | 300 | 500 | 700 | 1000 |
| PANEL | | | | | | | | |
| Chrome-copper-chrome | 30 | 36 | 36 | 40 | 50 | 52 | 51 | 59 |
| Nickel-acrylic (control 2.5 mls.) | 22 | 36 | 37 | 46 | 53 | 53 | 53 | 59 |

Thus, it is seen that although the nickel-acrylic conventional control has a thickness of about 200 times that of the chrome-copper-chrome composite of this invention, both panels have equivalent shielding effectiveness. In adhesion tests it is further seen that the laminated composite coating of this invention has a high degree of adhesion to the plastic substrate.

In addition to the NORYL substrate, substrates of ABS, polyimides, polyesters, polyamide, polycarbonates, glass, and ceramics give equivalent results. Additional panels of the above substrates using all combinations of the following for the layers: Chromium and stainless steel as the adhesive layer, aluminum and copper as the shielding layer, and chromium and stainless steel as the outermost protective layer; likewise provide equivalent results.

I claim:

1. A method of manufacturing a panel for shielding the passage of electromagnetic radio frequency interference therethrough, comprising:
   (a) subjecting a surface of an electrically insulating substrate sheet material to glow-discharge treatment to provide an active surface that is chemically reactive with vapors of chromium or stainless steel at an air pressure less than about $5 \times 10^{-5}$ TORR;
   (b) vapor plating chromium or stainless steel onto said active surface to provide an adhesive layer of chromium or stainless steel chemically bound to said surface, said layer having a thickness within the range of about 300 Angstroms to about 1,000 Angstroms;
   (c) vapor plating an aluminum or copper shielding layer onto the adhesive layer of (b) prior to substantial oxidation of the adhesive layer surface, said shielding layer having a thickness within the range of about 1,000 Angstroms to about 50,000 Angstroms; and then
   (d) vapor plating a chromium protective layer onto said shielding layer of (c), said protective layer having a thickness of at least about 1,000 Angstroms; to provide a relatively low cost, durable, shielded panel for shielding the passage of electromagnetic radio frequency interference therethrough.

2. The method of manufacturing the panel in claim 1 wherein the surface in (a) is glow-discharge treated in air at a pressure of 100 to 200 microns of mercury with a plasma voltage of about 1,000 to 2,000 volts.

3. The method of manufacturing the panel in claim 10 wherein in (b), (c), and (d) the vapor plating is at an air pressure of less than about $5 \times 10^{-5}$ TORR.

4. The method of manufacturing the panel in claim 1 wherein said adhesive layer in (b) is comprised of chromium having a thickness within the range of about 300 to 500 Angstroms.

5. The method of manufacturing the panel in claim 4 wherein said shielding layer is comprised of copper having a thickness within the range of about 2,000 to 10,000 Angstroms.

6. The method of manufacturing the panel in claim 5 wherein said protective layer is comprised of chromium having a thickness within the range of about 2,000 to 5,000 Angstroms.

7. The method of manufacturing the panel in claim 1, 2, 3, 4, 5, or 6 wherein said substrate sheet material is selected from the group of materials consisting of plastic and ceramic.

8. The method of manufacturing the panel in claim 7 wherein said substrate sheet material is a plastic selected from the group consisting of polyphenylene, polyimide, polyacrylonitrile-butadienestyrene (ABS), polyester, polyamide, and polycarbonate.

9. The method of manufacturing the panel in claim 7 wherein said ceramic is glass.

* * * * *